(12) United States Patent
Hsu et al.

(10) Patent No.: US 10,825,383 B2
(45) Date of Patent: Nov. 3, 2020

(54) DISPLAY DEVICE

(71) Applicant: Au Optronics Corporation, Hsinchu (TW)

(72) Inventors: Li-Chih Hsu, Taipei (TW); Yung-Chih Chen, Taichung (TW); Chun-Hsin Liu, Yunlin County (TW); Ya-Ting Hsu, Hsinchu (TW); Wan-Lin Chen, Hsinchu (TW); Wan-Tsang Wang, Hsinchu (TW); Tsung-Ying Ke, Tainan (TW); Keh-Long Hwu, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/411,155

(22) Filed: May 14, 2019

(65) Prior Publication Data
US 2020/0160783 A1 May 21, 2020

(30) Foreign Application Priority Data

Nov. 21, 2018 (TW) .............................. 107141413 A

(51) Int. Cl.
*G09G 3/3225* (2016.01)
*H01L 27/32* (2006.01)

(52) U.S. Cl.
CPC ....... *G09G 3/3225* (2013.01); *H01L 27/3262* (2013.01); *H01L 27/3276* (2013.01); *G09G 2310/0264* (2013.01)

(58) Field of Classification Search
CPC .......... G09G 3/3225; G09G 2310/0264; H01L 27/3262; H01L 27/3276
See application file for complete search history.

(56) References Cited

U.S. PATENT DOCUMENTS

| 2009/0103036 A1* | 4/2009 | Onodera | H01L 27/12 349/144 |
| 2013/0147691 A1* | 6/2013 | Koyama | G09G 3/3674 345/76 |
| 2018/0204501 A1* | 7/2018 | Guo | G09G 3/2085 |

FOREIGN PATENT DOCUMENTS

| CN | 104465707 | 3/2015 |
| CN | 105869564 | 8/2016 |
| CN | 205539855 | 8/2016 |
| JP | 2007319277 | 12/2007 |

* cited by examiner

*Primary Examiner* — Charles V Hicks
(74) *Attorney, Agent, or Firm* — JCIPRNET

(57) ABSTRACT

A display device including a first substrate, pixel structures, a second substrate, first signal lines, and second signal lines is provided. The pixel structures are disposed on a first surface of the first substrate. Each of the pixel structures includes a switch element and a pixel electrode. The switch element has a first terminal, a second terminal, and a control terminal. The pixel electrode is electrically connected to the second terminal of the switch element. The second substrate is disposed under a second surface of the first substrate. The first signal lines and the second signal lines are disposed on the second substrate. The first terminals and the control terminals of the switch elements of the pixel structures are respectively electrically connected to the first signal lines and the second signal lines, wherein the first signal lines are substantially parallel to the second signal lines.

20 Claims, 11 Drawing Sheets

DISPLAY DEVICE

CROSS-REFERENCE TO RELATED APPLICATION

This application claims the priority benefit of Taiwan application Ser. No. 107141413, filed on Nov. 21, 2018. The entirety of the above-mentioned patent application is hereby incorporated by reference herein and made a part of this specification.

BACKGROUND OF THE INVENTION

Field of the Invention

The disclosure relates to an optoelectronic device and, more particularly, to a display device.

Description of Related Art

To satisfy consumers' demand for high-quality viewing experience, the screen ratio of display devices has been increasing. However, as the resolution is improved, the lines disposed around the display region also significantly increase, which limits the space around the display region and seriously hinders the realization of a high screen ratio. In addition, when gate signals are input to a plurality of pixel structures of the display device, due to the difference in the lengths of signal lines designed to transmit the gate signals, the gate signals input to the pixel structures across the display panel can hardly be kept stable and uniform. For example, this issue is particularly noticeable in display devices (e.g., watches) having a circular display region and results in distortion of the signals input to the pixel structures and degradation of the display quality.

SUMMARY OF THE INVENTION

The invention provides a display device having a high screen ratio.

A display device according to an embodiment of the invention includes a first substrate, a plurality of pixel structures, a second substrate, a plurality of first signal lines, and a plurality of second signal lines. The first substrate has a first surface and a second surface opposite to each other. The plurality of pixel structures are disposed on the first substrate, wherein each of the plurality of pixel structures includes a switch element and a pixel electrode. The switch element is disposed on the first surface of the first substrate and has a first terminal, a second terminal, and a control terminal. The pixel electrode is disposed on the first surface of the first substrate and is electrically connected to the second terminal of the switch element. The second substrate is disposed under the second surface of the first substrate. The plurality of first signal lines and the plurality of second signal lines are disposed on the second substrate, wherein the plurality of first terminals of the plurality of switch elements of the plurality of pixel structures are electrically connected to the plurality of first signal lines, and the plurality of control terminals of the plurality of switch elements of the plurality of pixel structures are electrically connected to the plurality of second signal lines, wherein the plurality of first signal lines are substantially parallel to the plurality of second signal lines.

A display device according to another embodiment of the invention includes a first substrate, a plurality of pixel structures, a second substrate, a plurality of first signal lines, a plurality of second signal lines, and at least one gate driving circuit. The first substrate has a first surface and a second surface opposite to each other. The plurality of pixel structures are disposed on the first substrate, wherein each of the plurality of pixel structures includes a switch element and a pixel electrode. The switch element is disposed on the first surface of the first substrate and has a first terminal, a second terminal, and a control terminal. The pixel electrode is disposed on the first surface of the first substrate and is electrically connected to the second terminal of the switch element. The second substrate is disposed under the second surface of the first substrate. The plurality of first signal lines are disposed on the second substrate and are electrically connected to the plurality of first terminals of the plurality of switch elements of the plurality of pixel structures. The plurality of second signal lines are disposed on the second substrate and are electrically connected to the plurality of control terminals of the plurality of switch elements of the plurality of pixel structures, wherein the plurality of second signal lines include at least one second signal line set. The at least one gate driving circuit is disposed on the second substrate, is located between two adjacent first signal lines, and is electrically connected to the at least one second signal line set.

To make the aforementioned more comprehensible, several embodiments accompanied with drawings are described in detail as follows.

DESCRIPTION OF THE EMBODIMENTS

Figure 1A:
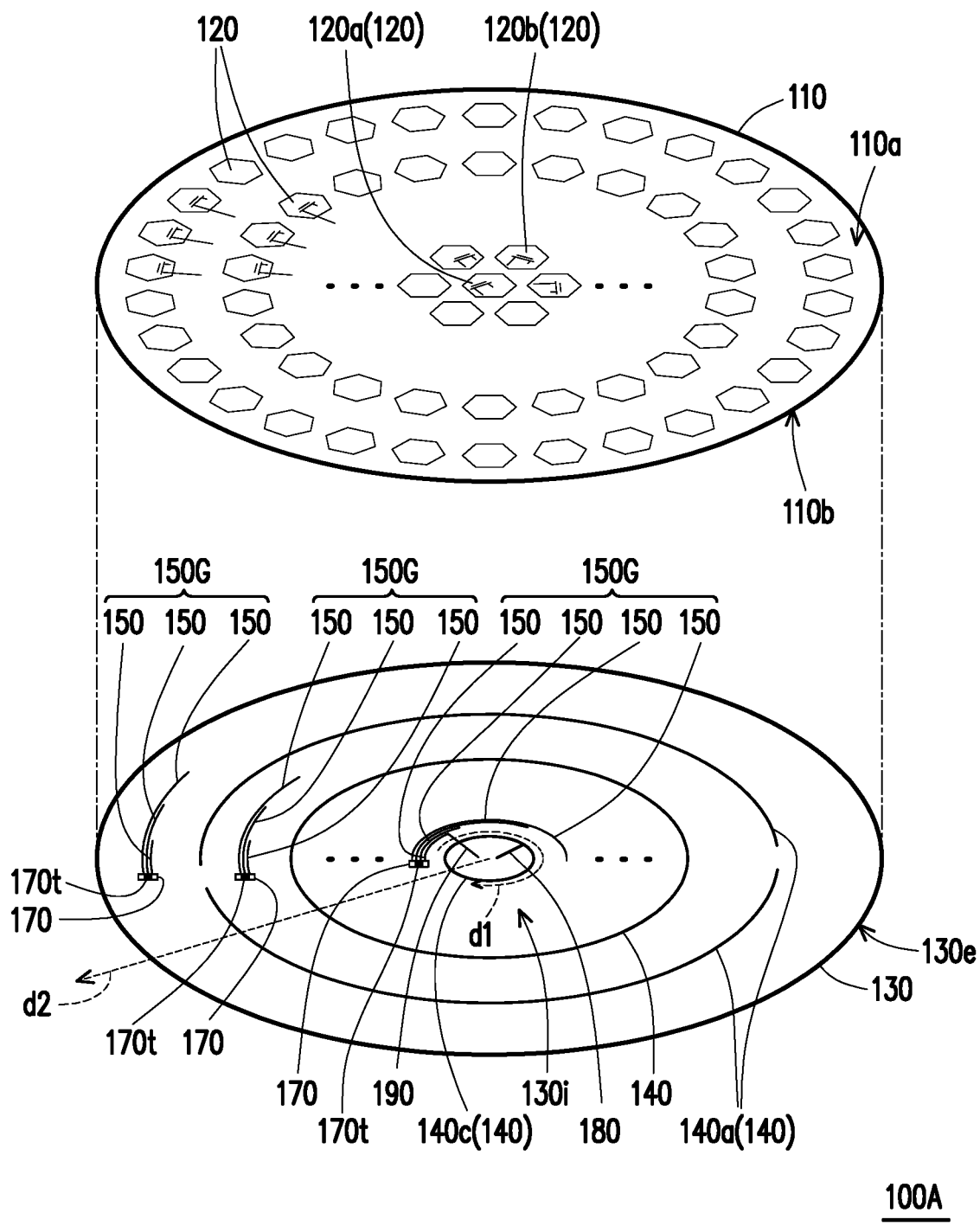
FIG. 1A is a schematic exploded perspective view of a display device according to an embodiment of the invention.

In the accompanying drawings, thicknesses of layers, films, panels, regions and so on are exaggerated for clarity. Throughout the specification, the same reference numerals in the accompanying drawings denote the same devices. It should be understood that when a device such as a layer, film, region or substrate is referred to as being "on" or "connected to" another device, it may be directly on or connected to another device, or intervening devices may also be present. In contrast, when a device is referred to as being "directly on" or "directly connected to" another device, there are no intervening devices present. As used herein, the term "connected" may refer to physical connection and/or electrical connection. Besides, if two devices are "electrically connected" or "coupled", it is possible that other devices are present between these two devices.

Moreover, relative terms such as "below" or "bottom" and "above" or "top" may serve to describe the relation between one component and another component herein as shown in the drawings. It should also be understood that the relative terms are intended to include different orientations of a device in addition to the orientation shown in the drawings. For example, if a device in the drawings is turned upside down, a component described as being "below" another component shall be re-orientated to be "above" the another component. Thus, the exemplary term "below" may include the orientations of "below" and "above", depending on the specific orientation of the drawings. Similarly, if a device in the drawings is turned upside down, a component described to be "under" or "below" another component shall be re-oriented to be "above" the another component. Therefore, the exemplary term "under" or "below" may include orientations of "above" and "below".

The term "about," "approximately," or "substantially" as used herein is inclusive of the stated value and means within an acceptable range of deviation for the particular value as determined by people having ordinary skill in the art, considering the measurement in question and the error associated with measurement of the particular quantity (i.e., the limitations of the measurement system). For example, "about" may mean within one or more standard deviations, for example, ±30%, ±20%, ±10%, or ±5% of the stated value. Moreover, a relatively acceptable range of deviation or standard deviation may be chosen for the term "about," "approximately," or "substantially" as used herein based on optical properties, etching properties or other properties, instead of applying one standard deviation across all the properties.

Exemplary embodiments are described herein with reference to schematic cross-sectional views illustrating idealized embodiments. Hence, variations of shapes resulting from manufacturing technologies and/or tolerances, for instance, are to be expected. The embodiments described herein should not be construed as being limited to the particular shapes of regions as illustrated herein but are to include deviations in shapes that result, for example, from manufacturing. For instance, regions shown or described as being flat may typically have rough and/or non-linear features. Besides, the acute angle as shown may be round. That is, the regions shown in the drawings are schematic in nature, and their shapes are not intended to show the exact shape of the regions, and are not intended to limit the scope of the claims.

Reference will now be made in detail to exemplary embodiments provided in the disclosure, examples of which are illustrated in accompanying drawings. Wherever possible, identical reference numerals are used in the drawings and descriptions to refer to identical or similar parts.

Figure 1B:
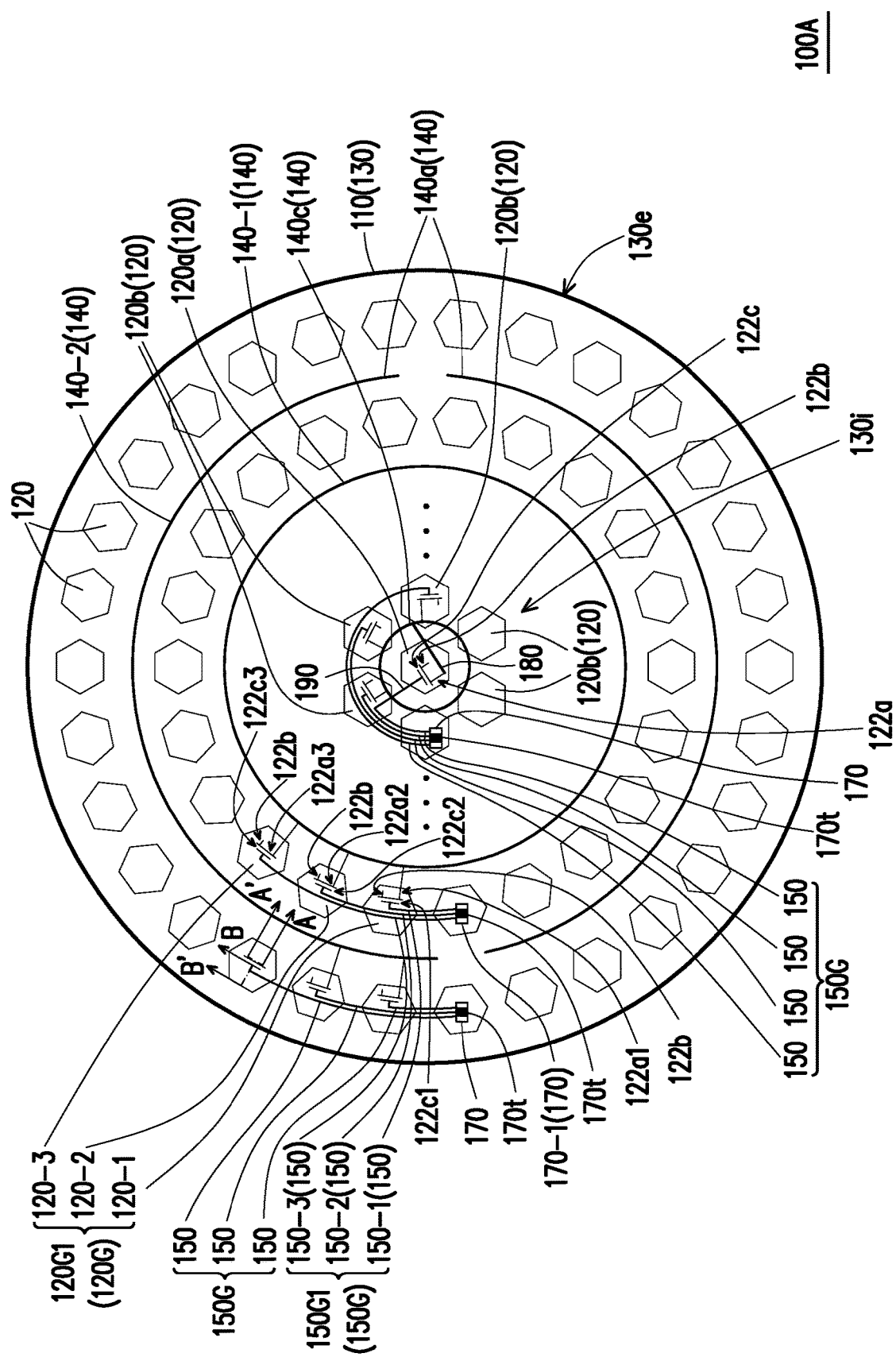
FIG. 1B is a schematic top view of a display device according to an embodiment of the invention.
Figure 1C:
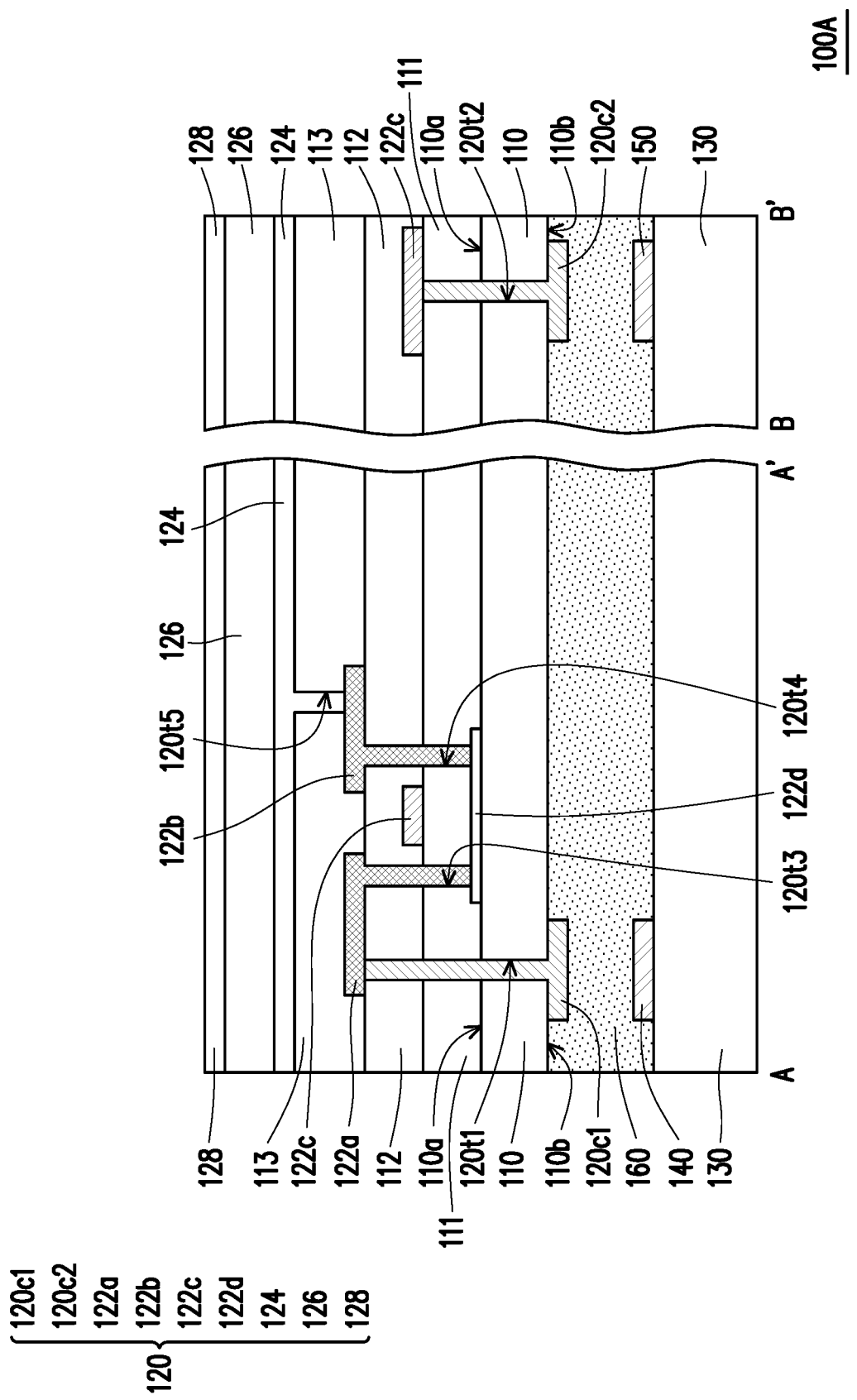
FIG. 1C is a schematic cross-sectional view of a display device according to an embodiment of the invention.

FIG. 1A is a schematic exploded perspective view of a display device according to an embodiment of the invention. FIG. 1B is a schematic top view of a display device according to an embodiment of the invention. For clarity, FIG. 1A and FIG. 1B show switch elements 122 of part of pixel structures 120, and omit the switch elements 122 of the rest of the pixel structures 120. FIG. 1A and FIG. 1B omit illustration of an electrical connection layer 160, an insulating layer 111, an insulating layer 112, an insulating layer 113, a pixel electrode 124, a display medium 126, and a common electrode 128 of FIG. 1C. FIG. 1C is a schematic cross-sectional view of a display device according to an embodiment of the invention. FIG. 1C corresponds to cross-sectional line A-A' and cross-sectional line B-B' of a display device 100A of FIG. 1B.

Referring to FIG. 1A to FIG. 1C, in the present embodiment, the display device 100A includes a first substrate 110, a plurality of pixel structures 120, and a second substrate 130. The first substrate 110 has a first surface 110a and a second surface 110b which are opposite to each other. The plurality of pixel structures 120 are disposed on the first substrate 110. Each of the plurality of pixel structures 120 includes a switch element 122 and a pixel electrode 124. The switch element 122 is disposed on the first surface 110a of the first substrate 110 and has a first terminal 122a, a second terminal 122b, and a control terminal 122c. The pixel electrode 124 is disposed on the first surface 110a of the first substrate 110 and is electrically connected to the second terminal 122b of the switch element 122. For example, in the present embodiment, a light-emitting region of the pixel structure 120 is schematically shown as a hexagon, but the invention is not limited thereto. According to other embodiments, the light-emitting region of the pixel structure 120 may also be in other shapes.

In the present embodiment, the switch element 122 is, for example, a thin-film transistor (TFT), but the invention is not limited thereto. The first terminal 122a, the second terminal 122b, and the control terminal 122c of the switch element 122 may respectively be a source, a drain, and a gate of the thin-film transistor, but the invention is not limited thereto. In the present embodiment, each of the switch elements 122 of the plurality of pixel structures 120 further includes a semiconductor pattern 122d (shown in FIG. 1C). For example, the first terminal 122a and the second terminal 122b of the switch element 122 may be respectively electrically connected to two different regions of the semiconductor pattern 122d via a plurality of through-holes 120t3 and 120t4 of a plurality of insulating layers 111 and 112. In the present embodiment, each of the plurality of pixel structures 120 further includes a display medium 126 and a common electrode 128. The pixel electrode 124 is electrically connected to the second terminal 122b of the switch element 122 via a through-hole 120t5, and the potential difference between the pixel electrode 124 and the common electrode 128 is used to drive the display medium 126. In the present embodiment, the display medium 126 is, for example, an organic light-emitting diode (OLED). However, the invention is not limited thereto, and in another embodiment, the display medium 126 may also be a liquid crystal, a micro light-emitting diode (μLED), or another suitable material.

The second substrate 130 is disposed below the second surface 110b of the first substrate 110. A plurality of first signal lines 140 and a plurality of second signal lines 150 are disposed on the second substrate 130. The plurality of first terminals 122a of the plurality of switch elements 122 of the plurality of pixel structures 120 are electrically connected to the plurality of first signal lines 140, and the plurality of control terminals 122c of the plurality of switch elements 122 of the plurality of pixel structures 120 are electrically connected to the plurality of second signal lines 150. The plurality of first signal lines 140 are substantially parallel to the plurality of second signal lines 150. In other words, the plurality of first signal lines 140 do not intersect with the plurality of second signal lines 150. For example, in the present embodiment, one first signal line 140 may be an annular line segment (e.g., an annular first signal line 140c) or a first arc line segment (e.g., an arc-shaped first signal line 140a), and at least one second signal line 150 may be a second arc line segment parallel to a portion of the annular line segment or a second arc line segment parallel to the first arc line segment, but the invention is not limited thereto.

In addition, it is noted that the form of the first signal line 140 and/or the form of the second signal line 150 is not limited to the arc line segment or the straight line segment. In other embodiments, the first signal line 140 and/or the second signal line 150 may also be line segments in other forms such as a zigzag line, but the invention is not limited thereto.

Furthermore, the invention does not limit that the form of the first signal line 140 and/or the form of the second signal line 150 should be completely identical. For example, in an embodiment, one first signal line 140 may be an arc line segment extending in a first arc line direction, and one second signal line 150 may be a turning line segment disposed in a second arc line direction, wherein the first arc line direction is substantially parallel to the second arc line direction. In an embodiment, one first signal line 140 may be a turning line segment disposed in a first arc line direction, and one second signal line 150 may be an arc line segment extending in a second arc line direction, wherein the first arc line direction is substantially parallel to the second arc line direction. In an embodiment, one first signal line 140 may be a turning line segment disposed in a first arc line direction, and one second signal line 150 may be another turning line segment disposed in a second arc line direction, wherein the first arc line direction is substantially parallel to the second arc line direction. In an embodiment, one first signal line 140 may be a straight line segment extending in a first straight line direction, and one second signal line 150 may be a turning line segment disposed in a second straight line direction, wherein the first straight line direction is substantially parallel to the second straight line direction. In an embodiment, one first signal line 140 may be a turning line segment disposed in a first straight line direction, and one second signal line 150 may be a turning line segment disposed in a second straight line direction, wherein the first straight line direction is substantially parallel to the second straight line direction. In an embodiment, one first signal line 140 may be a turning line segment disposed in a first straight line direction, and one second signal line 150 may be a turning line segment extending in a second straight line direction, wherein the first straight line direction is substantially parallel to the second straight line direction.

Referring to FIG. 1C, in the present embodiment, each of the plurality of pixel structures 120 may include a first contact 120c1 and a second contact 120c2. The first substrate 110 has a first through-hole 120t1 extending from the first surface 110a of the first substrate 110 to the second surface 110b of the first substrate 110. The first contact 120c1 is disposed on the first through-hole 120t1 and is electrically connected to the first terminal 122a of the switch element 122. The first substrate 110 has a second through-hole 120t2 extending from the first surface 110a of the first substrate 110 to the second surface 110b of the first substrate 110. The second contact 120c2 is disposed on the second through-hole 120t2 and is electrically connected to the control terminal 122c of the switch element 122. In the present embodiment, the plurality of first terminals 122a of the plurality of switch elements 122 of the plurality of pixel structures 120 are electrically connected to the plurality of first signal lines 140 via the plurality of first contacts 120c1 of the plurality of pixel structures 120. The plurality of control terminals 122c of the plurality of switch elements 122 of the plurality of pixel structures 120 are electrically connected to the plurality of second signal lines 150 via the plurality of second contacts 120c2 of the plurality of pixel structures 120.

For example, in the present embodiment, the display device 100A may optionally include an electrical connection layer 160 (shown in FIG. 1C) disposed between the second surface 110b of the first substrate 110 and the second substrate 130. The plurality of first contacts 120c1 and the plurality of second contacts 120c2 of the plurality of pixel structures 120 may be electrically connected to the plurality of first signal lines 140 and the plurality of second signal lines 150 via the electrical connection layer 160. In the present embodiment, the electrical connection layer 160 is, for example, an anisotropic conductive film (ACF). However, the invention is not limited thereto, and according to other embodiments, the electrical connection layer 160 may also be a solder layer or another suitable member.

In the present embodiment, a data signal (not labeled) included in the first signal line 140 located on the second substrate 130 may be transmitted to the first terminal 122a of the switch element 122 located on the first substrate 110 sequentially via the electrical connection layer 160 and the first contact 120c1. Similarly, a gate signal (not labeled) included in the second signal line 150 located on the second substrate 130 may be transmitted to the control terminal 122c of the switch element 122 located on the first substrate 110 sequentially via the electrical connection layer 160 and the second contact 120c2.

It is noted that, in the display device 100A, the plurality of pixel structures 120 are disposed on the first substrate 110, and the first signal line 140 and the second signal line 150 configured to be electrically connected to the plurality of pixel structures 120 are disposed on the second substrate 130. Accordingly, it is not required to dispose the first signal line 140 and the second signal line 150 in a peripheral region of the first substrate 110, and most of the area of the first substrate 110 can be used to dispose the plurality of pixel structures 120, which thereby achieves a high screen-to-body ratio.

Referring to FIG. 1A and FIG. 1B, in the present embodiment, the plurality of second signal lines 150 include at least one second signal line set 150G disposed between two adjacent first signal lines 140 of the plurality of first signal lines 140. In the present embodiment, the display device 100A further includes at least one gate driving circuit 170 which is disposed on the second substrate 130, located between the two adjacent first signal lines 140, and electrically connected to the at least one second signal line set 150G. Referring to FIG. 1B, for example, in the present embodiment, a second signal line set 150G1 includes, for example, second signal lines 150-1, 150-2, and 150-3 disposed between a first signal line 140-1 and a first signal line 140-2 which are adjacent to each other, but the invention is not limited thereto. A gate driving circuit 170-1 is located between the adjacent first signal line 140-1 and first signal line 140-2 and is electrically connected to the second signal line set 150G1. In the present embodiment, the number of the plurality of second signal lines 150 of one second signal line set 150G may be optionally increased or decreased according to the actual requirements, and the number of the plurality of second signal lines 150 of one second signal line set 150G is not limited to that shown in the drawings. In addition, it is noted that the present embodiment only exemplarily shows that the number of the gate driving circuit 170 located between two adjacent first signal lines 140 is one. However, those ordinarily skilled in the art shall understand that the number of the gate driving circuit 170 located between two adjacent first signal lines 140 of the present embodiment may be optionally configured as one or plural according to the actual requirements. In the present embodiment, the gate driving circuit 170 is, for example, a shift register, but the invention is not limited thereto. In the present embodiment, each of the plurality of gate driving circuits 170 may include a thin-film transistor 170t configured to control the gate signal to be output at different timings.

Referring to FIG. 1B, in the present embodiment, the plurality of pixel structures 120 include at least one pixel structure set 120G. An orthogonal projection of the at least one pixel structure set 120G on the second substrate 130 is located between orthogonal projections of two adjacent first signal lines 140 on the second substrate 130. In the present embodiment, the plurality of first terminals 122a of the plurality of pixel structures 120 of the at least one pixel structure set 120G are electrically connected to one of the two adjacent first signal lines 140, and the plurality of control terminals 122c of the plurality of pixel structures 120 of the at least one pixel structure set 120G are respectively electrically connected to the plurality of second signal lines 150 of the at least one second signal line set 150G. Accordingly, the plurality of pixel structures 120 of the same pixel structure set 120G can be independently controlled.

For example, referring to FIG. 1B, in the present embodiment, a pixel structure set 120G1 includes, for example, pixel structures 120-1, 120-2, and 120-3, but the invention is not limited thereto. The orthogonal projection of the pixel structure set 120G1 on the second substrate 130 is located between orthogonal projections of the adjacent first signal line 140-1 and first signal line 140-2 on the second substrate 130. The pixel structures 120-1, 120-2, and 120-3 of the pixel structure set 120G1 respectively have first terminals 122a1, 122a2, and 122a3, and the first terminals 122a1, 122a2, and 122a3 of the pixel structures 120-1, 120-2, and 120-3 are electrically connected to the first signal line 140-1. The pixel structures 120-1, 120-2, and 120-3 of the pixel structure set 120G1 respectively have control terminals 122c1, 122c2, and 122c3, and the control terminals 122c1, 122c2, and 122c3 are respectively electrically connected to the second signal lines 150-1, 150-2, and 150-3 of the second signal line set 150G1. One gate driving circuit 170 is electrically connected to the plurality of control terminals 120c of the plurality of pixel structures 120 of one pixel structure set 120G through the plurality of second signal lines 150 of one second signal line set 150G. In addition, it noted that the present embodiment only exemplarily shows that the number of the second signal line set 150G located between two adjacent first signal lines 140 is one. However, it is understood by those skilled in the art that the number of the second signal line sets 150G located between two adjacent first signal lines 140 of the present embodiment may be optionally one or plural according to the actual requirements.

It is noted that, in the present embodiment, at least one gate driving circuit 170 is disposed on the second substrate 130, and the at least one gate driving circuit 170 is located between two adjacent first signal lines 140. Accordingly, the at least one gate driving circuit 170 can be electrically connected to the plurality of control terminals 122c of the plurality of pixel structures 120 respectively through the plurality of second signal lines 150 which do not differ significantly in length. In other words, a plurality of impedances of the plurality of second signal lines 150 respectively electrically connected to the plurality of pixel structures 120 do not differ significantly. As a result, a plurality of gate signals input to the pixel structures 120 located across the display device 100A can be easily kept stable and uniform, which contributes to improving the performance of the display device 100A.

In the present embodiment, the plurality of pixel structures 120 include a first pixel structure 120a and a plurality of second pixel structures 120b surrounding the first pixel structure 120a, and the plurality of second pixel structures 120b are electrically connected to the annular first signal line 140c. In the present embodiment, the display device 100A further includes a first connection line 180 disposed on the second substrate 130. The first connection line 180 and the annular first signal line 140c intersect with each other and are electrically connected to each other, and the first terminal 122a of the first pixel structure 120a is electrically connected to the first connection line 180. Accordingly, the first terminal 122a of the first pixel structure 120a surrounded by the plurality of second pixel structures 120b can be electrically connected to the annular first signal line 140c through the first connection line 180.

In the present embodiment, the display device 100A further includes a second connection line 190 disposed on the second substrate 130. The second connection line 190 and one of the plurality of second signal lines 150 intersect with each other and are electrically connected to each other, and the control terminal 122c of the first pixel structure 120a is electrically connected to the second connection line 190. Accordingly, the control terminal 122c of the first pixel structure 120a surrounded by the plurality of second pixel structures 120b can be electrically connected to the gate driving circuit 170 through the second connection line 190 and the one second signal line 150. In the present embodiment, the second connection line 190 may cross over the first signal line 140, the second connection line 190 and the first signal line 140 may be respectively formed at two different film layers, and an insulating layer (not shown) may be disposed between the two film layers.

In the present embodiment, the plurality of first signal lines 140 extend in a first direction d1 (e.g., a clockwise or counterclockwise direction, but the invention is not limited thereto). The plurality of first signal lines 140 and the plurality of second signal line sets 150G are alternately arranged in a second direction d2 (e.g., a radial direction, but the invention is not limited thereto). The second direction d2 intersects with the first direction d1 and extends from an inner part 130i of the second substrate 130 to an edge 130e of the second substrate 130. In the present embodiment, the plurality of first signal lines 140 include the annular first signal line 140c and the plurality of arc-shaped first signal lines 140a. The arc-shaped first signal lines 140a are separated from each other and disposed between the annular first signal line 140c and the edge 130e of the second substrate 130. In other words, if the display device 100A has a circular display region, the arc-shaped first signal lines 140a are the first signal lines 140 disposed on the periphery of the circular display region, and the annular first signal line 140c is the first signal line 140 disposed on the inner part of the circular display region. In the present embodiment, the length of one arc-shaped first signal line 140a adjacent to the edge 130e of the second substrate 130 may be substantially the same as or similar to the length of one annular first signal line 140c away from the edge 130e of the second substrate 130. In other words, the impedance of one arc-shaped first signal line 140a may be substantially the same as or similar to the impedance of one annular first signal line 140c, which contributes to improving the performance of the display device 100A.

Figure 2:
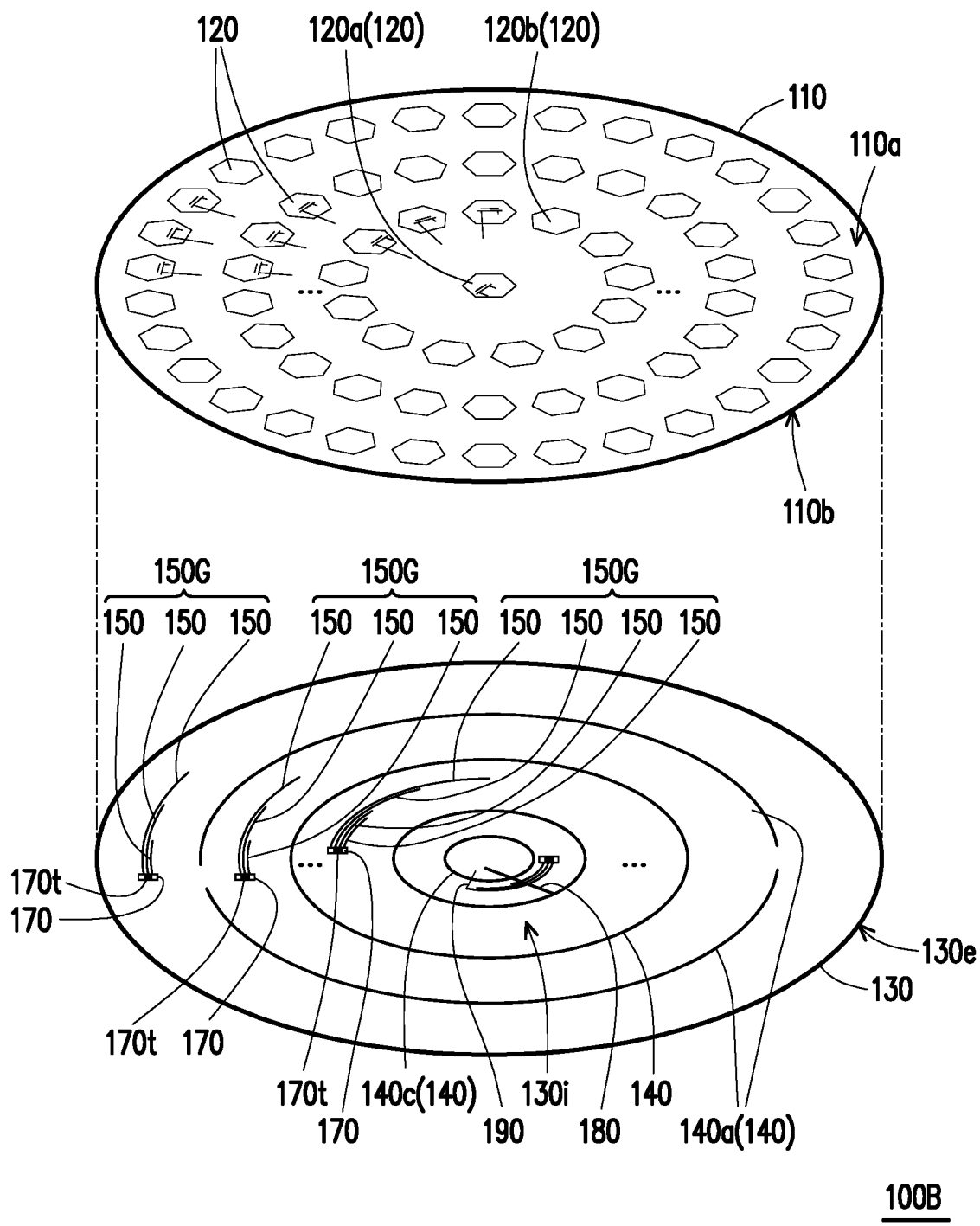
FIG. 2 is a schematic exploded perspective view of a display device according to another embodiment of the invention.

FIG. 2 is a schematic exploded perspective view of a display device according to another embodiment of the invention. FIG. 2 shows the switch elements 122 of part of the pixel structures 120 as an example, and omits the switch elements 122 of the rest of the pixel structures 120. Referring to FIG. 1A and FIG. 2, a display device 100B of the present embodiment is similar to the display device 100A of FIG. 1A. The difference between the display device 100B and the display device 100A will be described below, and the same or similar parts of the display device 100B and the display device 100A will not be repeatedly described herein. In the present embodiment, the first connection line 180 may cross over at least one second signal line 150, and the first connection line 180 and the second signal line 150 are respectively formed at two different film layers. The second connection line 190 may cross over the first signal line 140, and the second connection line 190 and the first signal line 140 are respectively formed at two different film layers.

Figure 3:
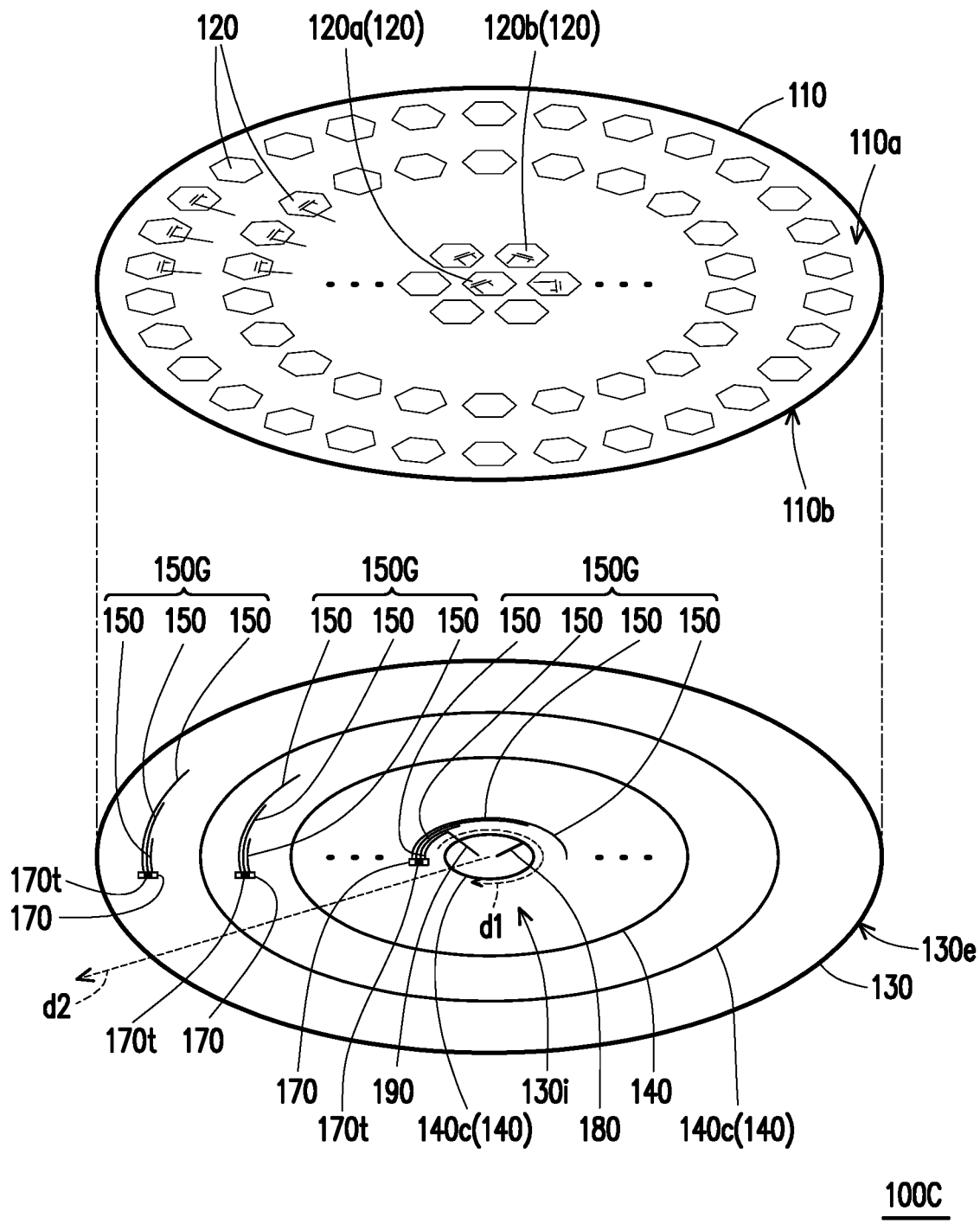
FIG. 3 is a schematic exploded perspective view of a display device according to still another embodiment of the invention.

FIG. 3 is a schematic exploded perspective view of a display device according to still another embodiment of the invention. FIG. 3 shows the switch elements 122 of part of the pixel structures 120 as an example, and omits the switch elements 122 of the rest of the pixel structures 120. Referring to FIG. 1A and FIG. 3, a display device 100C of the present embodiment is similar to the display device 100A of FIG. 1A. The difference between the display device 100C of FIG. 3 and the display device 100A of FIG. 1A will be described below, and the same or similar parts of the display device 100C and the display device 100A will not be repeatedly described herein. In the present embodiment, it is possible that arc-shaped first signal lines are not provided on the second substrate 130 of the display device 100C. The plurality of first signal lines 140 on the second substrate 130 of the display device 100C may optionally be a plurality of concentrically arranged annular first signal lines 140c.

Figure 4:
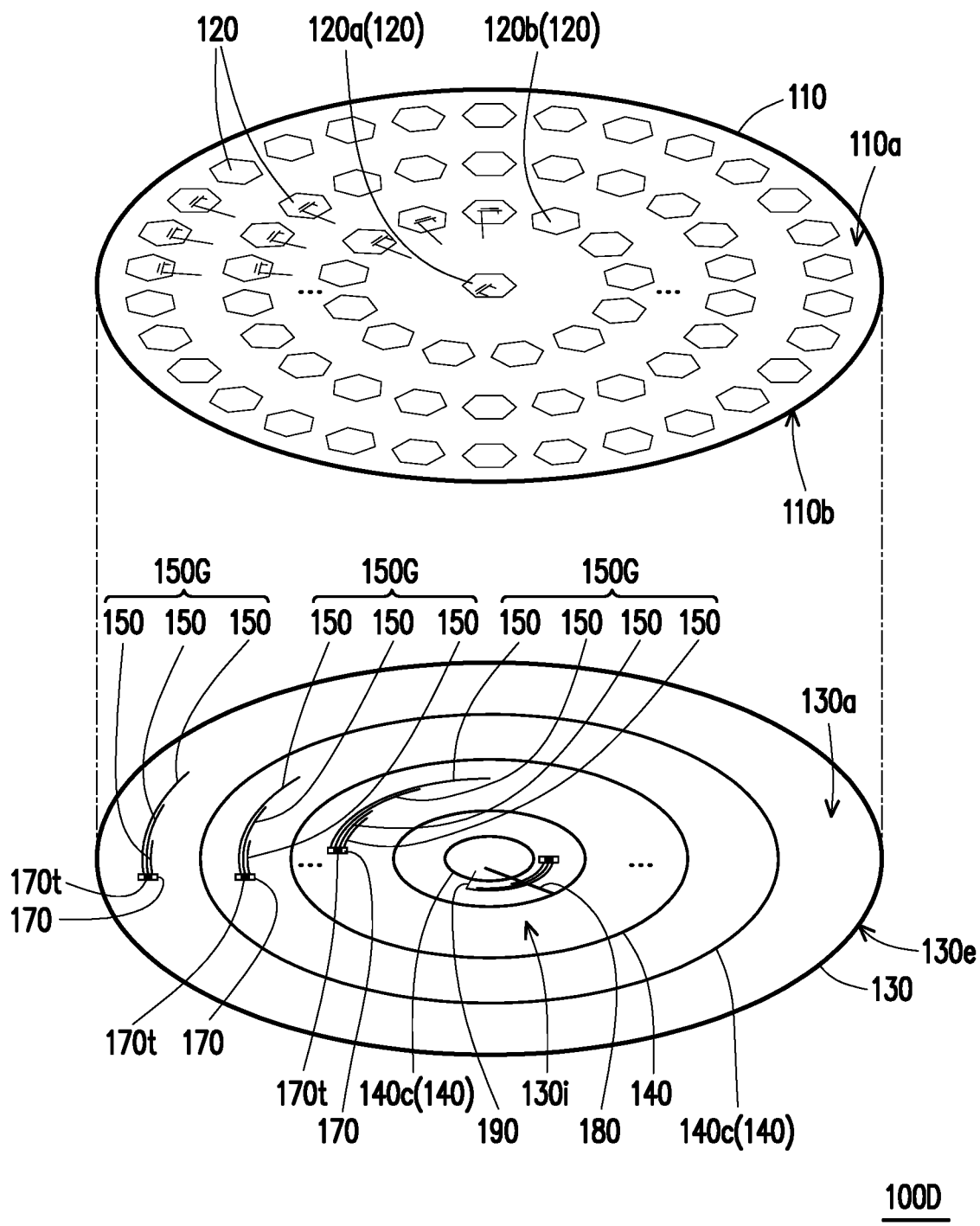
FIG. 4 is a schematic exploded perspective view of a display device according to still another embodiment of the invention.

FIG. 4 is a schematic exploded perspective view of a display device according to still another embodiment of the invention. Referring to FIG. 2 and FIG. 4, a display device 100D of the present embodiment is similar to the display device 100B of FIG. 2. The difference between the display device 100D of FIG. 4 and the display device 100B of FIG. 2 will be described below, and the same or similar parts of the display device 100D and the display device 100B will not be repeatedly described herein. In the present embodiment, it is possible that arc-shaped first signal lines are not provided on the second substrate 130 of the display device 100D. The plurality of first signal lines 140 on the second substrate 130 of the display device 100D may optionally be a plurality of concentrically arranged annular first signal lines 140c.

Figure 5A:
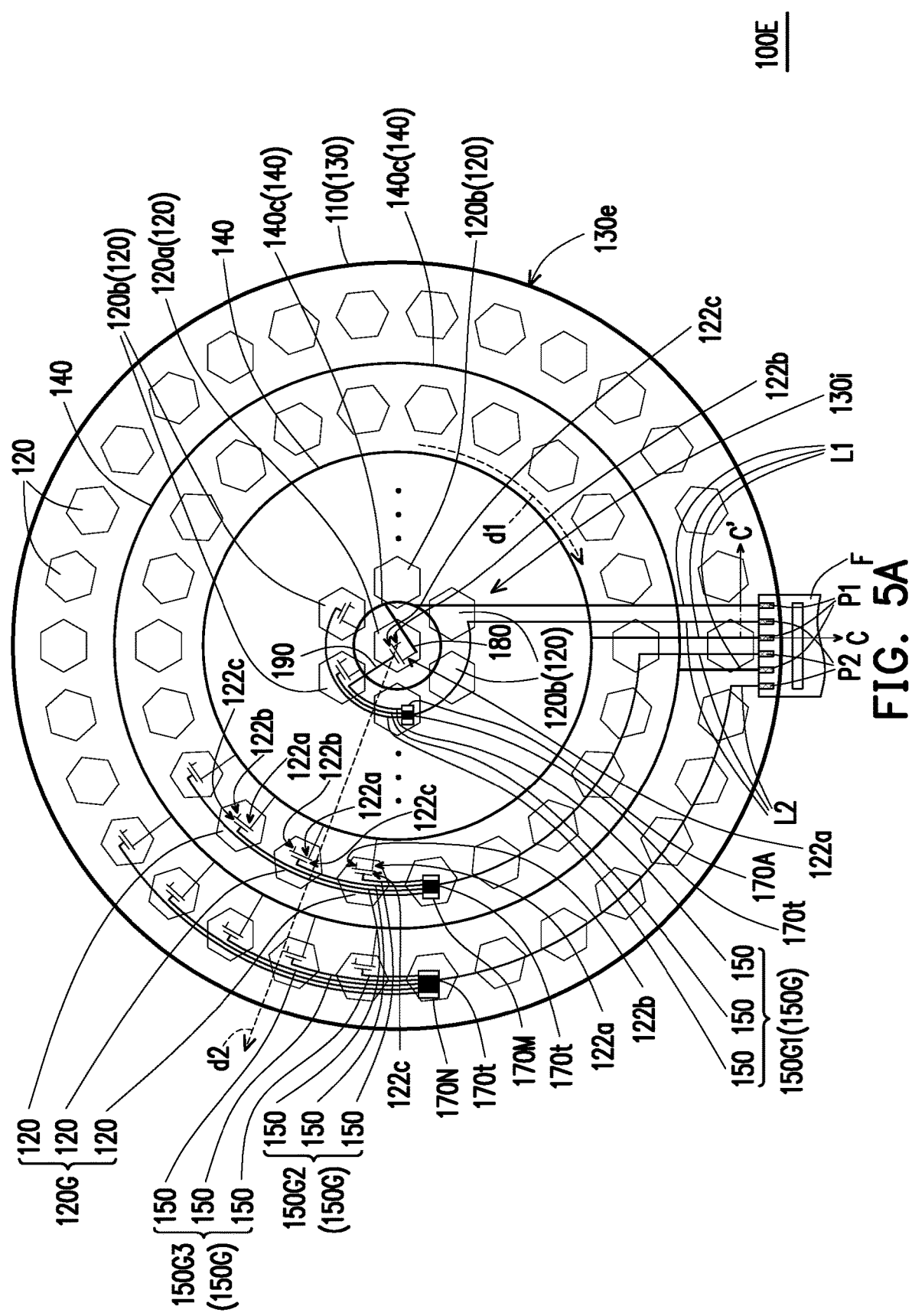
FIG. 5A is a schematic top view of a display device according to an embodiment of the invention.
Figure 5B:
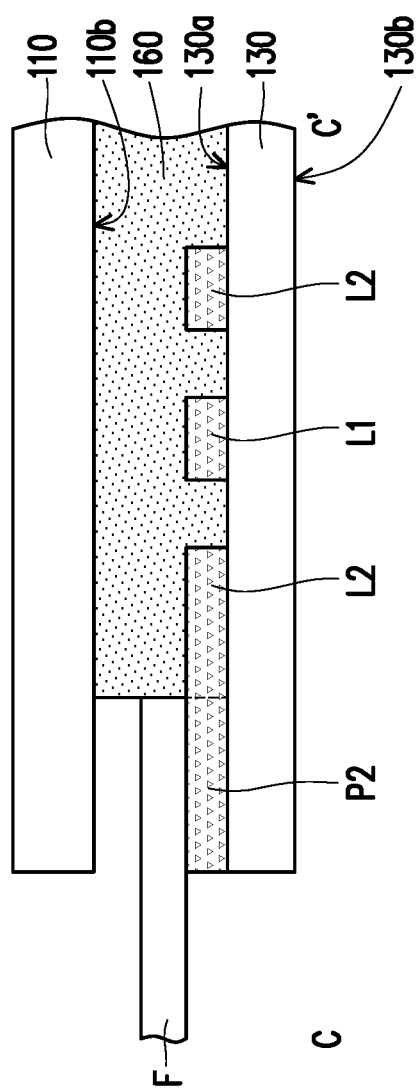
FIG. 5B is a schematic cross-sectional view of a display device according to an embodiment of the invention.

FIG. 5A is a schematic top view of a display device according to an embodiment of the invention. FIG. 5B is a schematic cross-sectional view of a display device according to an embodiment of the invention. FIG. 5B corresponds to cross-sectional line C-C' of FIG. 5A.

Referring to FIG. 1B and FIG. 5A, a display device 100E of the present embodiment is similar to the display device 100A of FIG. 1B. The difference between the display device 100E of FIG. 5A and the display device 100A of FIG. 1B will be described below, and the same or similar parts of the display device 100E and the display device 100A will not be repeatedly described herein. In the present embodiment, the plurality of first signal lines 140 extend in the first direction d1. The second direction d2 intersects with the first direction d1 and extends from the inner part 130i of the second substrate 130 to the edge 130e of the second substrate 130. The plurality of second signal lines 150 include $1^{st}$ to $N^{th}$ second signal line sets 150G1, 150G2, and 150G3 sequentially arranged in the second direction d2, wherein N is a positive integer greater than or equal to 2. The plurality of first signal lines 140 and the $1^{st}$ to $N^{th}$ second signal line sets 150G1, 150G2, and 150G3 are alternately arranged in the second direction d2. The display device 100E further includes $1^{st}$ to $N^{th}$ gate driving circuits 170A, 170M, and 170N respectively electrically connected to the $1^{st}$ to $N^{th}$ second signal line sets 150G1, 150G2, and 150G3. In particular, the size of the $N^{th}$ gate driving circuit 170 is larger than the size of the $1^{st}$ gate driving circuit 170. For example, when N=2, the size of the $2^{nd}$ gate driving circuit 170M electrically connected to the $2^{nd}$ second signal line set 150G2 is larger than the size of the $1^{st}$ gate driving circuit 170A electrically connected to the $1^{st}$ second signal line set 150G1. When N=3, the size of the $3^{rd}$ gate driving circuit 170N electrically connected to the $3^{rd}$ second signal line set 150G3 is larger than the size of the $1^{st}$ gate driving circuit 170A electrically connected to the $1^{st}$ second signal line set 150G1. In the present embodiment, it is preferable that the size of the $N^{th}$ gate driving circuit 170 is larger than the size of the $(N-1)^{th}$ gate driving circuit 170. For example, the size of the $3^{rd}$ gate driving circuit 170N electrically connected to the $3^{rd}$ second signal line set 150G3 is larger than the size of the $2^{nd}$ gate driving circuit 170M electrically connected to the $2^{nd}$ second signal line set 150G2, and the size of the $2^{nd}$ gate driving circuit 170M electrically connected to the $2^{nd}$ second signal line set 150G2 is larger than the size of the $1^{st}$ gate driving circuit 170A electrically connected to the $1^{st}$ second signal line set 150G1.

As the size of the gate driving circuit 170 becomes larger, the driving capability becomes greater, and the gate driving circuit 170 can drive more pixel structures 120 through more second signal lines 150. For example, each of the plurality of gate driving circuits 170A, 170M, and 170N includes at least one thin-film transistor 170t. The size of the thin-film transistor 170t of the $N^{th}$ gate driving circuit 170 is larger than the size of the thin-film transistor 170t of the $1^{st}$ gate driving circuit 170. The size of the thin-film transistor 170t refers to, for example, the area of the semiconductor pattern 122d of the thin-film transistor 170t, but the invention is not limited thereto. Specifically, when N=2, the size of the thin-film transistor 170t of the $2^{nd}$ gate driving circuit 170M electrically connected to the $2^{nd}$ second signal line set 150G2 is larger than the size of the thin-film transistor 170t of the $1^{st}$ gate driving circuit 170A electrically connected to the $1^{st}$ second signal line set 150G1. When N=3, the size of the thin-film transistor 170t of the $3^{rd}$ gate driving circuit 170N electrically connected to the $3^{rd}$ second signal line set 150G3 is larger than the size of the thin-film transistor 170t of the $1^{st}$ gate driving circuit 170A electrically connected to the $1^{st}$ second signal line set 150G1. In the present embodiment, it is preferable that the size of the thin-film transistor 170t of the $N^{th}$ gate driving circuit 170 is larger than the size of the thin-film transistor 170t of the $(N-1)^{th}$ gate driving circuit 170. For example, the size of the thin-film transistor 170t of the $3^{rd}$ gate driving circuit 170N electrically connected to the $3^{rd}$ second signal line set 150G3 is larger than the size of the thin-film transistor 170t of the $2^{nd}$ gate driving circuit 170M electrically connected to the $2^{nd}$ second signal line set 150G2. The size of the thin-film transistor 170t of the $2^{nd}$ gate driving circuit 170M electrically connected to the $2^{nd}$ second signal line set 150G2 is larger than the size of the thin-film transistor 170t of the 1$^{st}$ gate driving circuit 170A electrically connected to the 1$^{st}$ second signal line set 150G1.

In the present embodiment, the number of the plurality of second signal lines 150 included in one of the plurality of second signal line sets 150G electrically connected to the N$^{th}$ gate driving circuit 170N is greater than the number of the plurality of second signal lines 150 included in another of the plurality of second signal line sets 150G electrically connected to the 1$^{st}$ gate driving circuit 170A. For example, the number (e.g., 4, but the invention is not limited thereto) of the plurality of second signal lines 150 included in the second signal line set 150G2 electrically connected to the 2$^{nd}$ gate driving circuit 170M is greater than the number (e.g., 3, but the invention is not limited thereto) of the plurality of second signal lines 150 included in the second signal line set 150G1 electrically connected to the 1$^{st}$ gate driving circuit 170A. The number (e.g., 5, but the invention is not limited thereto) of the plurality of second signal lines 150 included in the second signal line set 150G3 electrically connected to the 3$^{rd}$ gate driving circuit 170N is greater than the number (e.g., 3, but the invention is not limited thereto) of the plurality of second signal lines 150 included in the second signal line set 150G1 electrically connected to the 1$^{st}$ gate driving circuit 170A. In the present embodiment, it is preferable that the number of the plurality of second signal lines 150 included in one of the plurality of second signal line sets 150G electrically connected to the N$^{th}$ gate driving circuit 170M is greater than the number of the plurality of second signal lines 150 included in another of the plurality of second signal line sets 150G electrically connected to the (N-1)$^{th}$ gate driving circuit 170. For example, the number (e.g., 5, but the invention is not limited thereto) of the plurality of second signal lines 150 included in the second signal line set 150G3 electrically connected to the 3$^{rd}$ gate driving circuit 170N is greater than the number (e.g., 4, but the invention is not limited thereto) of the plurality of second signal lines 150 included in the second signal line set 150G2 electrically connected to the 2$^{nd}$ gate driving circuit 170M. The number (e.g., 4, but the invention is not limited thereto) of the plurality of second signal lines 150 included in the second signal line set 150G2 electrically connected to the 2$^{nd}$ gate driving circuit 170M is greater than the number (e.g., 3, but the invention is not limited thereto) of the plurality of second signal lines 150 included in the second signal line set 150G1 electrically connected to the 1$^{st}$ gate driving circuit 170A.

In the present embodiment, the display device 100E further includes a plurality of first wires L1, a plurality of second wires L2, a plurality of first bonding pads P1, and a plurality of second bonding pads P2. The plurality of first wires L1 are disposed on the second substrate 130, intersect with the plurality of first signal lines 140, and are respectively electrically connected to the plurality of first signal lines 140. The plurality of second wires L2 are disposed on the second substrate 130 and are respectively electrically connected to the plurality of gate driving circuits 170. The plurality of first bonding pads P1 are disposed on the second substrate 130 and are respectively electrically connected to the plurality of first wires L1. The plurality of second bonding pads P2 are disposed on the second substrate 130 and are respectively electrically connected to the plurality of second wires L2. The plurality of first bonding pads P1 and the plurality of second bonding pads P2 are configured to be bonded with an external flexible circuit board F. The external flexible circuit board F is, for example, a chip on film (COF), but the invention is not limited thereto.

The second substrate 130 has a first surface 130a facing the first substrate 110 and a second surface 130b facing away from the first substrate 110. In the present embodiment, the plurality of first wires L1, the plurality of second wires L2, the plurality of first bonding pads P1, and the plurality of second bonding pads P2 may be disposed on the first surface 130a of the second substrate 130 or the second surface 130b of the second substrate 130. For example, the plurality of first wires L1, the plurality of second wires L2, the plurality of first bonding pads P1, and the plurality of second bonding pads P2 may be disposed on the first surface 130a of the second substrate 130. In other words, in the present embodiment, the plurality of first wires L1, the plurality of second wires L2, the plurality of first bonding pads P1, and the plurality of second bonding pads P2 may be optionally disposed on the same surface of the second substrate 130, but the invention is not limited thereto.

Figure 6A:
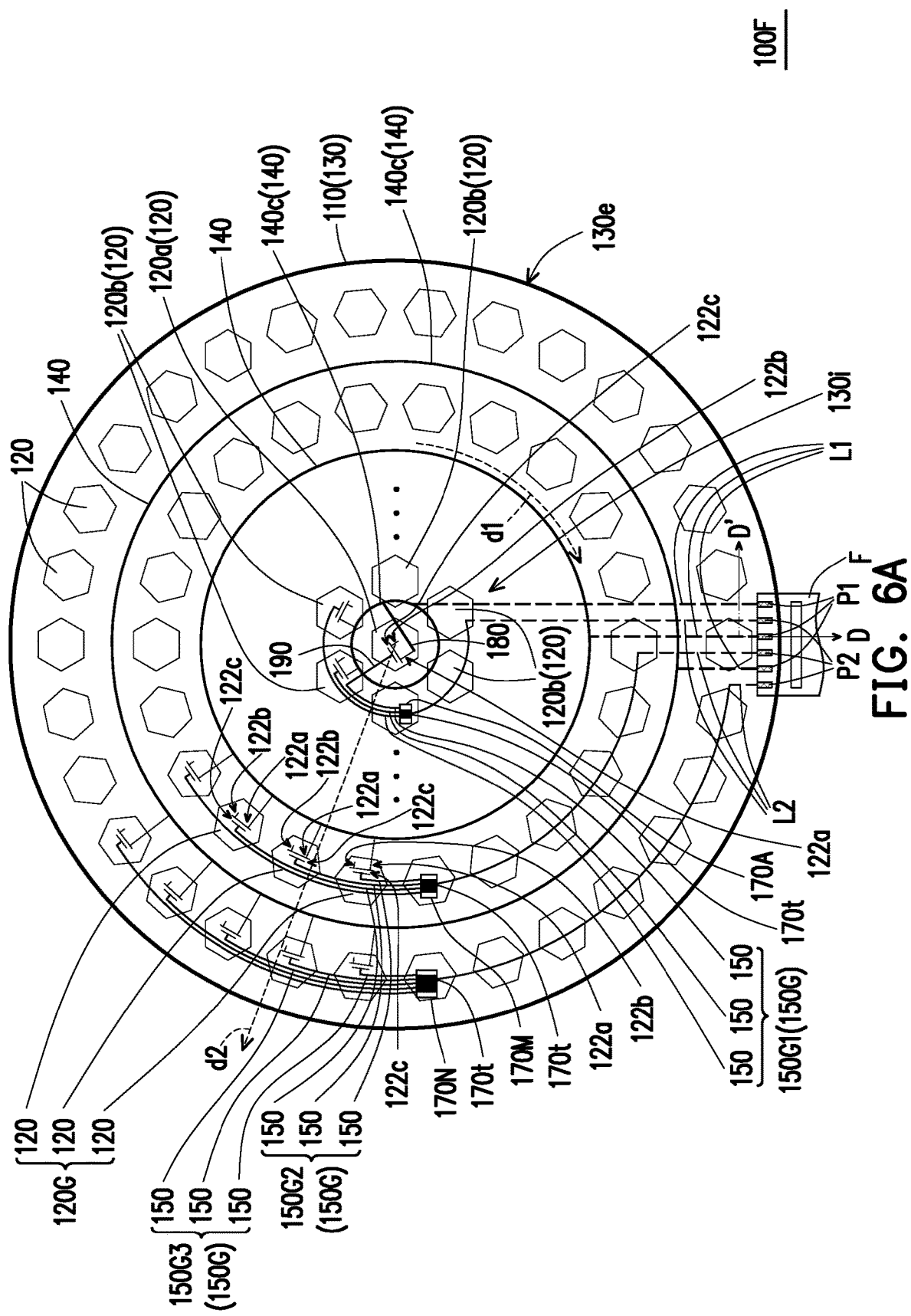
FIG. 6A is a schematic top view of a display device according to another embodiment of the invention.
Figure 6B:
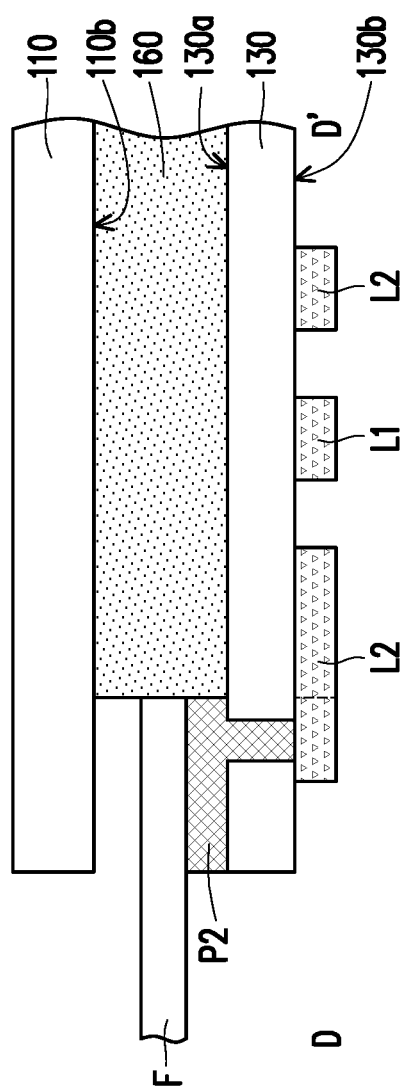
FIG. 6B is a schematic cross-sectional view of a display device according to another embodiment of the invention.

FIG. 6A is a schematic top view of a display device according to another embodiment of the invention. FIG. 6B is a schematic cross-sectional view of a display device according to another embodiment of the invention. FIG. 6B corresponds to cross-sectional line D-D' of FIG. 6A. Referring to FIG. 5A and FIG. 6A, a display device 100F of the present embodiment is similar to the display device 100E of FIG. 5A, and the difference lies in that the plurality of first wires L1 and the plurality of second wires L2 may be disposed on the second surface 130b of the second substrate 130, and the plurality of first bonding pads P1 and the plurality of second bonding pads P2 may be respectively disposed on the first surface 130a of the second substrate 130. In other words, in the present embodiment, the plurality of first wires L1 and the plurality of second wires L2, and the plurality of first bonding pads P1 and the plurality of second bonding pads P2 may be optionally respectively disposed on the two opposite surfaces of the second substrate 130.

Figure 7:
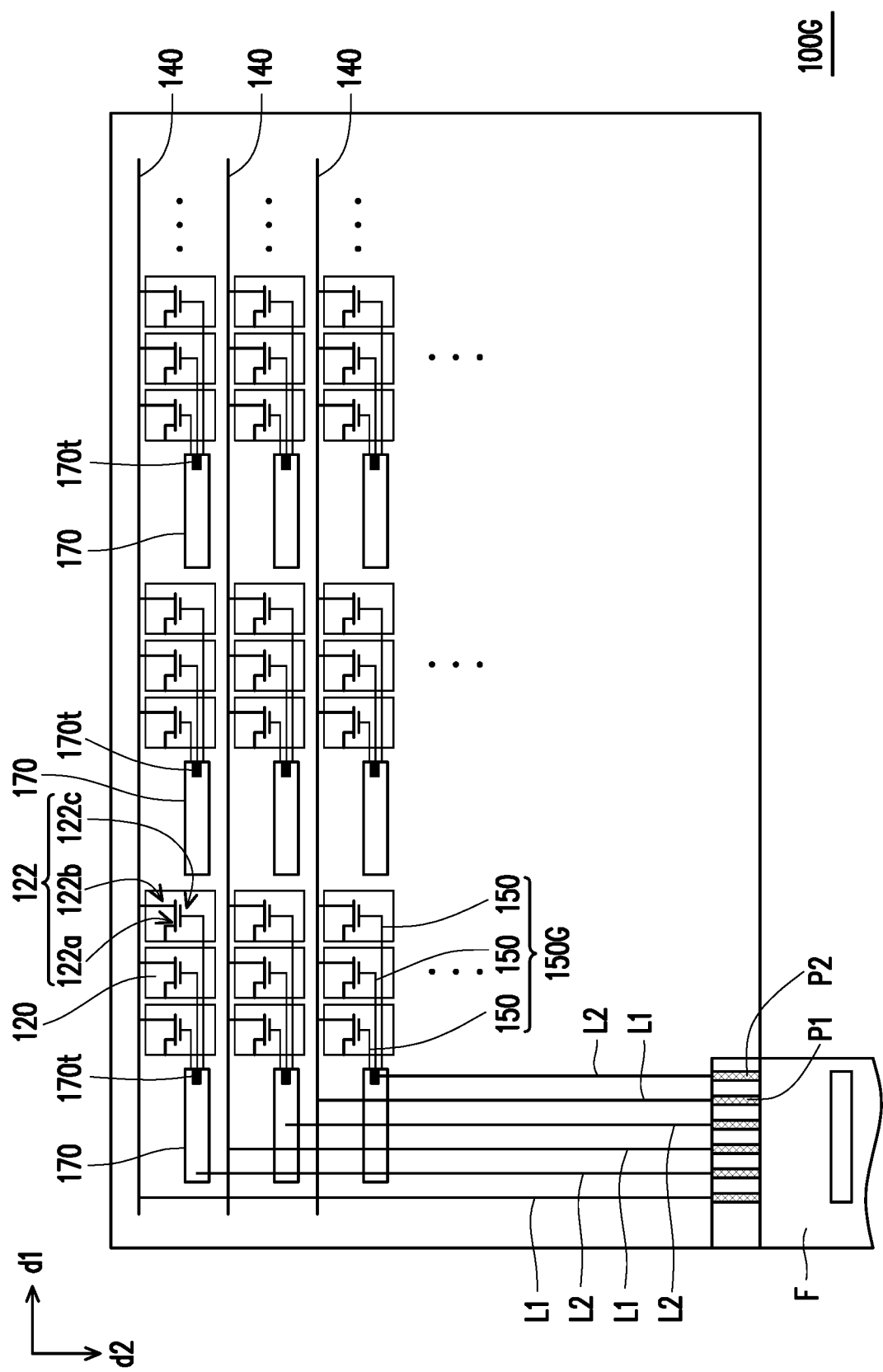
FIG. 7 is a schematic top view of a display device according to another embodiment of the invention.

FIG. 7 is a schematic top view of a display device according to another embodiment of the invention. Referring to FIG. 7, a display device 100G of the present embodiment is similar to the display device 100E of FIG. 5A. The difference between the display device 100G and the display device 100E will be described below. Referring to FIG. 7, similar to at least one of the foregoing embodiments, two adjacent first signal lines 140 extend in the first direction d1, and the plurality of gate driving circuits 170 located between the two adjacent first signal lines 140 are sequentially arranged in the first direction d1. The plurality of gate driving circuits 170 and the plurality of second signal line sets 150G located between the two adjacent first signal lines 140 are alternately arranged in the first direction d1. Different from the foregoing embodiments, in the present embodiment, the first substrate 110 and the second substrate 130 of the display device 100G may be rectangular substrates, and the light-emitting region of the pixel structure 120 is exemplarily shown as a rectangle. The difference between the display device 100G of the present embodiment and the display device 100E of FIG. 5A lies in that the display device 100G of the present embodiment has a rectangular display region, and the display device 100E of FIG. 5A has a display region in a free form such as a circle, but the invention is not limited thereto.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display device comprising:
   a first substrate having a first surface and a second surface opposite to each other;
   a plurality of pixel structures disposed on the first substrate, wherein each of the pixel structures comprises:
      a switch element disposed on the first surface of the first substrate and having a first terminal, a second terminal, and a control terminal; and
      a pixel electrode disposed on the first surface of the first substrate and electrically connected to the second terminal of the switch element;
   a second substrate disposed under the second surface of the first substrate; and
   a plurality of first signal lines and a plurality of second signal lines disposed on the second substrate, wherein the plurality of first terminals of the plurality of switch elements of the pixel structures are electrically connected to the first signal lines, and the plurality of control terminals of the switch elements of the pixel structures are electrically connected to the second signal lines, wherein the first signal lines are substantially parallel to the second signal lines.

2. The display device according to claim 1, wherein the second signal lines comprise at least one second signal line set disposed between two adjacent first signal lines among the first signal lines, and the display device further comprises:
   at least one gate driving circuit disposed on the second substrate, located between the two adjacent first signal lines, and electrically connected to the at least one second signal line set.

3. The display device according to claim 2, wherein the pixel structures comprise at least one pixel structure set, and an orthogonal projection of the at least one pixel structure set on the second substrate is located between orthogonal projections of the two adjacent first signal lines on the second substrate, wherein the plurality of first terminals of the plurality of pixel structures of the at least one pixel structure set are electrically connected to one of the two adjacent first signal lines, and the plurality of control terminals of the pixel structures of the at least one pixel structure set are respectively electrically connected to the plurality of second signal lines of the at least one second signal line set.

4. The display device according to claim 3, wherein the at least one second terminal line set is a plurality of second signal line sets, and the at least one gate driving circuit is a plurality of gate driving circuits, wherein the second signal line sets are respectively electrically connected to the gate driving circuits, the two adjacent first signal lines extend in a first direction, and the gate driving circuits are sequentially arranged in the first direction.

5. The display device according to claim 4, wherein the gate driving circuits and the second signal line sets are alternately arranged in the first direction.

6. The display device according to claim 1, wherein the first signal lines extend in a first direction, a second direction intersects with the first direction and extends from an inner part of the second substrate to an edge of the second substrate, the second signal lines comprise $1^{st}$ to $N^{th}$ second signal line sets sequentially arranged in the second direction, wherein N is a positive integer greater than or equal to 2, the first signal lines and the $1^{st}$ to $N^{th}$ second signal line sets are alternately arranged in the second direction, and the display device further comprises:
   $1^{st}$ to $N^{th}$ gate driving circuits respectively electrically connected to the $1^{st}$ to $N^{th}$ second signal line sets, wherein a size of the $N^{th}$ gate driving circuit is larger than a size of the $1^{st}$ gate driving circuit.

7. The display device according to claim 6, wherein a number of the plurality of second signal lines included in one of the second signal line sets electrically connected to the $N^{th}$ gate driving circuit is greater than a number of the plurality of second signal lines included in another of the second signal line sets electrically connected to the $1^{st}$ gate driving circuit.

8. The display device according to claim 6, wherein each of the gate driving circuits comprises a thin-film transistor, and a size of a thin-film transistor of the $N^{th}$ gate driving circuit is larger than a size of a thin-film transistor of the $1^{st}$ gate driving circuit.

9. The display device according to claim 1, wherein the first signal lines comprise an annular first signal line and a plurality of arc-shaped first signal lines, wherein the arc-shaped first signal lines are separated from each other and are disposed between the annular first signal line and an edge of the second substrate.

10. The display device according to claim 1, wherein the first signal lines comprise an annular first signal line, the pixel structures comprise a first pixel structure and a plurality of second pixel structures surrounding the first pixel structure, the second pixel structures are electrically connected to the annular first signal line, and the display device further comprises:
    a first connection line disposed on the second substrate, intersecting with and electrically connected to the annular first signal line, wherein a first terminal of the first pixel structure is electrically connected to the first connection line.

11. The display device according to claim 10, wherein the second signal lines are electrically connected to a plurality of control terminals of the second pixel structures, and the first connection line crosses over the second signal lines.

12. The display device according to claim 10, further comprising:
    a second connection line disposed on the second substrate, intersecting with and electrically connected to one of the second signal lines, wherein a control terminal of the first pixel structure is electrically connected to the second connection line.

13. A display device comprising:
    a first substrate having a first surface and a second surface opposite to each other;
    a plurality of pixel structures disposed on the first substrate, wherein each of the pixel structures comprises:
       a switch element disposed on the first surface of the first substrate and having a first terminal, a second terminal, and a control terminal; and
       a pixel electrode disposed on the first surface of the first substrate and electrically connected to the second terminal of the switch element;
    a second substrate disposed under the second surface of the first substrate;
    a plurality of first signal lines disposed on the second substrate and electrically connected to the plurality of first terminals of the plurality of switch elements of the pixel structures;
    a plurality of second signal lines disposed on the second substrate and electrically connected to the plurality of control terminals of the switch elements of the pixel structures, wherein the second signal lines comprise at least one second signal line set; and
    at least one gate driving circuit disposed on the second substrate, located within an area between two adjacent first signal lines among the first signal lines, and electrically connected to the at least one second signal line set.

14. The display device according to claim 13, wherein the pixel structures comprise at least one pixel structure set, and an orthogonal projection of the at least one pixel structure set on the second substrate is located between orthogonal projections of the two adjacent first signal lines on the second substrate, wherein the plurality of first terminals of the plurality of pixel structures of the at least one pixel structure set are electrically connected to one of the two adjacent first signal lines, and the plurality of control terminals of the pixel structures of the at least one pixel structure set are respectively electrically connected to the plurality of second signal lines of the at least one second signal line set.

15. The display device according to claim 14, wherein the at least one second terminal line set is a plurality of second signal line sets, and the at least one gate driving circuit is a plurality of gate driving circuits, wherein the second signal line sets are respectively electrically connected to the gate driving circuits, the two adjacent first signal lines extend in a first direction, and the gate driving circuits are sequentially arranged in the first direction.

16. The display device according to claim 15, wherein the gate driving circuits and the second signal line sets are alternately arranged in the first direction.

17. The display device according to claim 13, wherein the first signal lines extend in a first direction, a second direction intersects with the first direction and extends from an inner part of the second substrate to an edge of the second substrate, the second signal lines comprise $1^{st}$ to $N^{th}$ second signal line sets sequentially arranged in the second direction, wherein N is a positive integer greater than or equal to 2, the first signal lines and the $1^{st}$ to $N^{th}$ second signal line sets are alternately arranged in the second direction, and the at least one gate driving circuit comprises:

$1^{st}$ to $N^{th}$ gate driving circuits respectively electrically connected to the $1^{st}$ to $N^{th}$ second signal line sets, wherein a size of the $N^{th}$ gate driving circuit is larger than a size of the $1^{st}$ gate driving circuit.

18. The display device according to claim 17, wherein a number of the plurality of second signal lines included in one of the second signal line sets electrically connected to the $N^{th}$ gate driving circuit is greater than a number of the plurality of second signal lines included in another of the second signal line sets electrically connected to the $1^{st}$ gate driving circuit.

19. The display device according to claim 17, wherein each of the gate driving circuits comprises a thin-film transistor, and a size of a thin-film transistor of the $N^{th}$ gate driving circuit is larger than a size of a thin-film transistor of the $1^{st}$ gate driving circuit.

20. The display device according to claim 13, wherein the first signal lines comprise an annular first signal line and a plurality of arc-shaped first signal lines, wherein the arc-shaped first signal lines are separated from each other and are disposed between the annular first signal line and an edge of the second substrate.

* * * * *